(12) United States Patent
Chang

(10) Patent No.: US 11,881,283 B2
(45) Date of Patent: Jan. 23, 2024

(54) SEMICONDUCTOR MEMORY DEVICE AND MEMORY SYSTEM INCLUDING MEMORY CELL ARRAYS AND COLUMN SELECTION TRANSISTORS ARRANGED TO IMPROVE SIZE EFFICIENCY

(71) Applicant: SAMSUNG ELECTRONICS CO., LTD., Suwon-si (KR)

(72) Inventor: Soo Bong Chang, Incheon (KR)

(73) Assignee: Samsung Electronics Co., Ltd.

( * ) Notice: Subject to any disclaimer, the term of this patent is extended or adjusted under 35 U.S.C. 154(b) by 120 days.

(21) Appl. No.: 17/492,336

(22) Filed: Oct. 1, 2021

(65) Prior Publication Data
US 2022/0215863 A1 Jul. 7, 2022

(30) Foreign Application Priority Data
Jan. 6, 2021 (KR) ........................ 10-2021-0001490

(51) Int. Cl.
*G11C 7/10* (2006.01)
*G11C 5/06* (2006.01)
*G11C 7/12* (2006.01)
*G11C 7/14* (2006.01)

(52) U.S. Cl.
CPC .............. *G11C 7/1039* (2013.01); *G11C 5/06* (2013.01); *G11C 7/12* (2013.01); *G11C 7/14* (2013.01)

(58) Field of Classification Search
CPC ........... G11C 7/1039; G11C 7/07; G11C 7/14; G11C 5/06
USPC ........................................ 365/185.21, 185.05
See application file for complete search history.

(56) References Cited

U.S. PATENT DOCUMENTS

| 5,970,003 | A | 10/1999 | Miyatake et al. |
| 6,160,751 | A | 12/2000 | Tomishima |
| 7,573,767 | B2 | 8/2009 | Kajigaya |
| 7,724,591 | B2 | 5/2010 | Sato et al. |
| 9,595,315 | B2 * | 3/2017 | Han .................... G11C 11/4094 |
| 9,601,183 | B1 | 3/2017 | Kajigaya |
| 9,620,197 | B1 * | 4/2017 | Park .................... G11C 11/4096 |

(Continued)

FOREIGN PATENT DOCUMENTS

KR 20020031852 A 5/2002

OTHER PUBLICATIONS

Office Action for Taiwanese Application No. 110142944 dated Nov. 10, 2022, 2 pages. (No translation).

*Primary Examiner* — Connie C Yoha
(74) *Attorney, Agent, or Firm* — Myers Bigel, P.A.

(57) ABSTRACT

A semiconductor memory device includes first and second memory cell arrays spaced apart from each other in a first direction, a plurality of column selection transistors in a second direction which intersects the first direction, between the first and second memory cell arrays, at least two of the column selection transistors include respective portions of a central gate pattern, which intersects a central line extending in the first direction at a center of the first memory cell array and has a closed loop shape, and first and second local input/output lines configured to provide electric potential through the first memory cell array to a local sense amplifier based on operations of the column selection transistors. The first and second local input/output lines are electrically connected to the central gate pattern, and the center line is spaced apart from and does not intersect the first and second local input/output lines.

20 Claims, 14 Drawing Sheets

(56) References Cited

U.S. PATENT DOCUMENTS

2008/0080282 A1* 4/2008 Chang ................. G11C 11/4094
365/205
2012/0218804 A1 8/2012 Okayama
2022/0328093 A1* 10/2022 Chang .................... G11C 7/065

* cited by examiner

SEMICONDUCTOR MEMORY DEVICE AND MEMORY SYSTEM INCLUDING MEMORY CELL ARRAYS AND COLUMN SELECTION TRANSISTORS ARRANGED TO IMPROVE SIZE EFFICIENCY

CROSS-REFERENCE TO RELATED APPLICATION

This application claims priority to Korean Patent Application No. 10-2021-0001490, filed on Jan. 6, 2021, and all the benefits accruing therefrom under 35 U.S.C. § 119, the disclosure of which is incorporated herein by reference in its entirety.

BACKGROUND

The present disclosure relates to a semiconductor memory device and a memory system including the same.

With recent developments in the electronic industry, the demand for high-functionality, high-speed, and compact-size electronic parts and elements has increased. Recently, in order to improve the degree of integration of a semiconductor memory device, there has been a trend to reduce the sizes of a memory cell area and peripheral circuits near the memory cell area that drive memory cells. There is also a trend to increase the number of units of data that are processed to raise the speed of processing data. FIG. 3 includes some conventional features of a semiconductor memory device, which are a basis for discussion of the present inventive concepts presented herein. FIGS. 5 and 6 includes some conventional features of a sense amplifier, which are a basis for discussion of the present inventive concepts presented herein.

A method has been suggested in which a dummy cell area where data is not stored is provided in the memory cell area to increase the units of data that are processed. However, due to the presence of dummy cells, the sizes of the memory cell area and the peripheral circuits may increase.

SUMMARY

Embodiments of the present disclosure provide a semiconductor memory device capable of improving the size efficiency of a memory cell area by removing the area occupied by dummy cells in the memory cell area, while improving the unit of processing data.

Embodiments of the present disclosure also provide a semiconductor memory device capable of improving the size efficiency of peripheral circuits while improving the unit of processing data.

However, embodiments of the present disclosure are not restricted to those set forth herein. The above and other embodiments of the present disclosure will become more apparent to one of ordinary skill in the art to which the present disclosure pertains by referencing the detailed description of the present disclosure given below.

According to some embodiments of the present disclosure, there is provided a semiconductor device comprising first and second memory cell arrays spaced apart from each other in a first direction, a plurality of column selection transistors spaced apart from each other in a second direction which intersects the first direction. The plurality of column selection transistors are between the first and second memory cell arrays, and at least two of the column selection transistors include respective portions of a central gate pattern that intersects a central line extending in the first direction at a center of the first memory cell array and has a closed loop shape. The semiconductor device includes first and second local input/output lines configured to provide electric potential through the first memory cell array to a local sense amplifier based on operations of the column selection transistors. The first and second local input/output lines extend in the second direction and are electrically connected to the central gate pattern. The center line is spaced apart from, and does not intersect the first and second local input/output lines in a plan view.

According to some embodiments of the present disclosure, there is provided a semiconductor memory device including first and second memory cell arrays spaced apart from each other in a first direction, a central bitline of a plurality of bitlines that extends in a first direction over the first memory cell array. The central bitline is closest of ones of the plurality of bitlines to a center line that extends in the first direction at a center of the first memory cell array. The semiconductor memory device includes a first outer bitline of the plurality of bitlines, such that the first outer bitline extends in the first direction over the first memory cell array and is a farthest one of the plurality of bitlines from the center line in a second direction which intersects the first direction, a second outer bitline of the plurality of bitlines, such that the second outer bitline extends in the first direction over the first memory cell array and is a farthest one of the plurality of bitlines from the first outer bitline in the second direction, central column selection transistors configured to control electric potential between the central bitline and a local sense amplifier, a first outer column selection transistor configured to control electric potential between the first outer bitline and the local sense amplifier, and a second outer column selection transistor configured to control electric potential between the second outer bitline and the local sense amplifier. The first and second outer column selection transistors are configured to provide electric potential to the local sense amplifier while the central column selection transistors are providing electric potential to the local sense amplifier.

According to some embodiments of the present disclosure, there is provided a memory system including a memory controller configured to send a request for an input or an output of data, an input/output buffer configured to input or output the data in response to the request, first and second memory cell arrays configured to store the data and configured to input the data to or output the data from the input/output buffer. The first and second memory cell arrays are spaced apart from each other in a first direction. The memory system includes a plurality of column selection transistors in a second direction which intersects the first direction, between the first and second memory cell arrays. At least two of the column selection transistors include respective portions of a central gate pattern that intersects a central line extending in the first direction at a center of the first memory cell array and has a closed loop shape. The memory system includes first and second local input/output lines configured to provide electric potential through the first memory cell array to a local sense amplifier based on operations of the column selection transistors. The first and second local input/output lines extend in the second direction and are electrically connected to the central gate pattern, and the center line is spaced apart from and does not intersect the first and second local input/output lines in a plan view.

Other features and embodiments may be apparent from the following detailed description, the drawings, and the claims.

BRIEF DESCRIPTION OF THE DRAWINGS

The above and other embodiments and features of the present disclosure will become more apparent by describing in detail embodiments thereof with reference to the attached drawings, in which.

DETAILED DESCRIPTION

Figure 1:
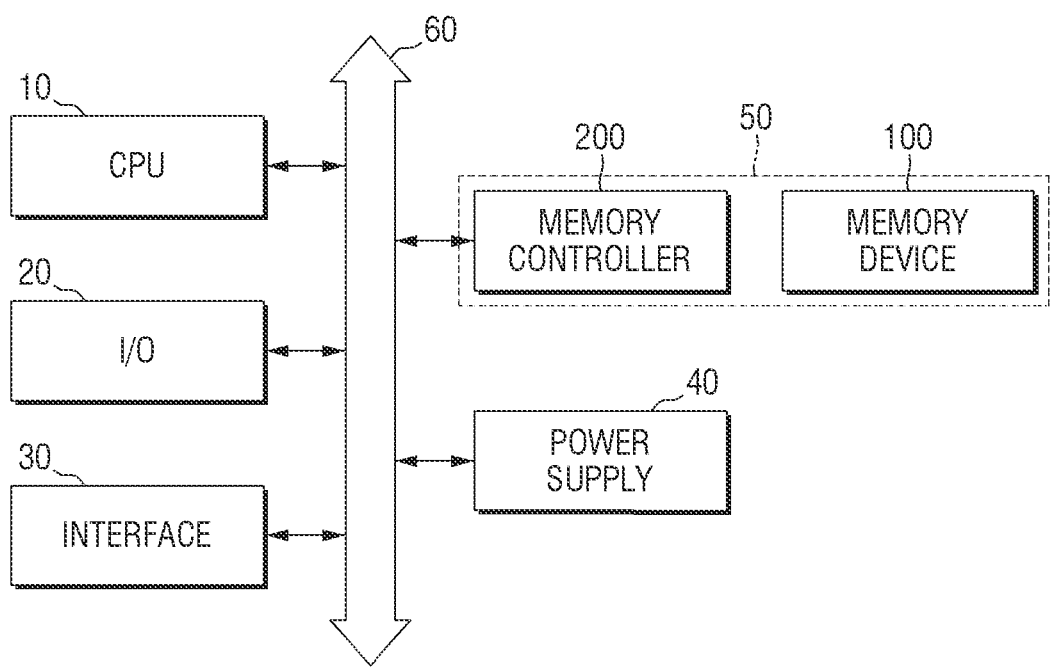
FIG. 1 is a block diagram of a computing system including a semiconductor memory device according to some embodiments of the present disclosure.

Embodiments of the present disclosure will hereinafter be described with reference to the accompanying drawings. In the drawings, like reference numerals indicate like elements or features, and thus, descriptions thereof will not be repeated. Also, in the drawings, similar elements or features are referred to by similar reference numerals.

FIG. 1 is a block diagram of a computing system including a semiconductor memory device, according to some embodiments of the present disclosure.

Referring to FIG. 1, a computing system 1 includes a central processing unit (CPU) 10 ("CPU"), an input/output (I/O) device 20 ("I/O"), an interface device 30 ("INTERFACE"), a power supply device 40 ("POWER SUPPLY"), and a memory system 50.

The CPU 10, the I/O device 20, the interface device 30, the power supply device 40, and the memory system 50 may be coupled to one another via a bus 60. The bus 60 corresponds to a path in which data is transmitted.

The CPU 10 may include one processor core (i.e., a single core) or multiple processor cores (i.e., a multicore) to process data. For example, the CPU 10 may include a multicore such as a dual core, a quad-core, or a hexa-core. The CPU 10 may further include various hardware devices (e.g., an intellectual property (IP) core). The CPU 10 may further include a cache memory, which is located on the inside or the outside of the CPU 10.

The I/O device 20 may include one or more input devices such as a keypad or a touchscreen and/or one or more output devices such as a speaker and/or a display device.

The interface device 30 may communicate with an external device in a wired or wireless manner. For example, the interface device 30 may perform Ethernet communication, near field communication (NFC), radio frequency identification (RFID) communication, mobile telecommunication, memory card communication, or universal serial bus (USB) communication.

The memory system 50 may store data processed by the CPU 10 or may operate as a working memory of the CPU 10. The memory system 50 may include a memory device 100 ("MEMORY DEVICE") and a memory controller 200 ("MEMORY CONTROLLER"). The memory device 100 and the memory controller 200 will be described later with reference to FIG. 2.

The power supply device 40 may convert power input thereto from an external source and may provide the converted power to the other elements of the computing system 1.

Although not specifically illustrated, the computing system 1 may further include a nonvolatile memory device. For example, the nonvolatile memory device may be a read-only memory (ROM), a programmable ROM (PROM), an electrically programmable ROM (EPROM), an electrically erasable programmable ROM (EEPROM), a flash memory, a phase-change random-access memory (PRAM), a resistive random-access memory (RRAM), or a ferroelectric random-access memory (FRAM).

The computing system 1 may be an arbitrary computing system such as a mobile phone, a smartphone, a personal digital assistant (PDA), a portable multimedia player (PMP), a digital camera, a music player, a portable game console, or a navigation system.

Steps of a method or algorithm described in connection with the embodiments disclosed herein may be embodied directly in hardware, in a software module, or in a combination of the two. A software module may reside in a random-access memory (RAM), a flash memory, a ROM, an EPROM, an EEPROM, a register, a hard disk, a removable disk, a CD-ROM, or any other form of storage medium known in the art. An example storage medium is coupled to a processor such that the processor can read information from, and write information to, the storage medium. In some embodiments, the storage medium may be integral to the processor. The processor and the storage medium may reside in an application specific integrated circuit (ASIC). The ASIC may reside in a user terminal. In some embodiments, the processor and the storage medium may reside as discrete components in the user terminal.

Figure 2:
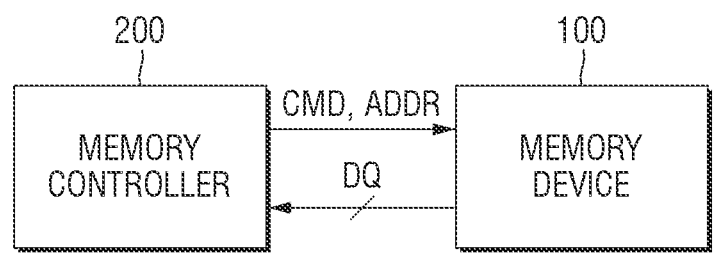
FIG. 2 is a block diagram of a memory system including a semiconductor memory device according to some embodiments of the present disclosure.

FIG. 2 is a block diagram of a memory system including a semiconductor memory device according to some embodiments of the present disclosure.

Referring to FIG. 2, the memory system includes a semiconductor memory device 100 and a memory controller 200.

The memory controller 200 is configured to control the semiconductor memory device 100. The memory controller 200 may access the semiconductor memory device 100 in response to a request from a host. For example, the memory controller 200 may write data to, or read data from, the semiconductor memory device 100.

The memory controller 200 may provide a command CMD and an address ADDR for the semiconductor memory device 100 and may exchange data DQ with the semiconductor memory device 100. The memory controller 200 may exchange 16-bit data DQ with the semiconductor memory device 100.

The memory controller 200 may be configured to run firmware for controlling the semiconductor memory device 100.

The semiconductor memory device 100 is configured to store data. For example, the memory device 100 may be a dynamic random access memory (DRAM) such as a double data rate static DRAM (DDR SDRAM), a single data rate static DRAM (SDR SDRAM), a low power DDR SDRAM (LPDDR SDRAM), a low power SDR SDRAM (LPSDR SDRAM), a Direct RDRAM, or a Rambus DRAM (RDRAM) or an arbitrary volatile memory device. Particularly, the memory device 100 may be a device to which standards such as DDR4 or DDR5 are applied.

For example, the number of data pins of a DDR4 or DDR5 memory system may be 4, 8, or 16, and the number of data pins of the memory system 50 may be 16, according to some example embodiments. The number of data pins of the memory system 50 is not particularly limited and may vary depending on the DRAM standard applied to the memory system 50.

Figure 3:
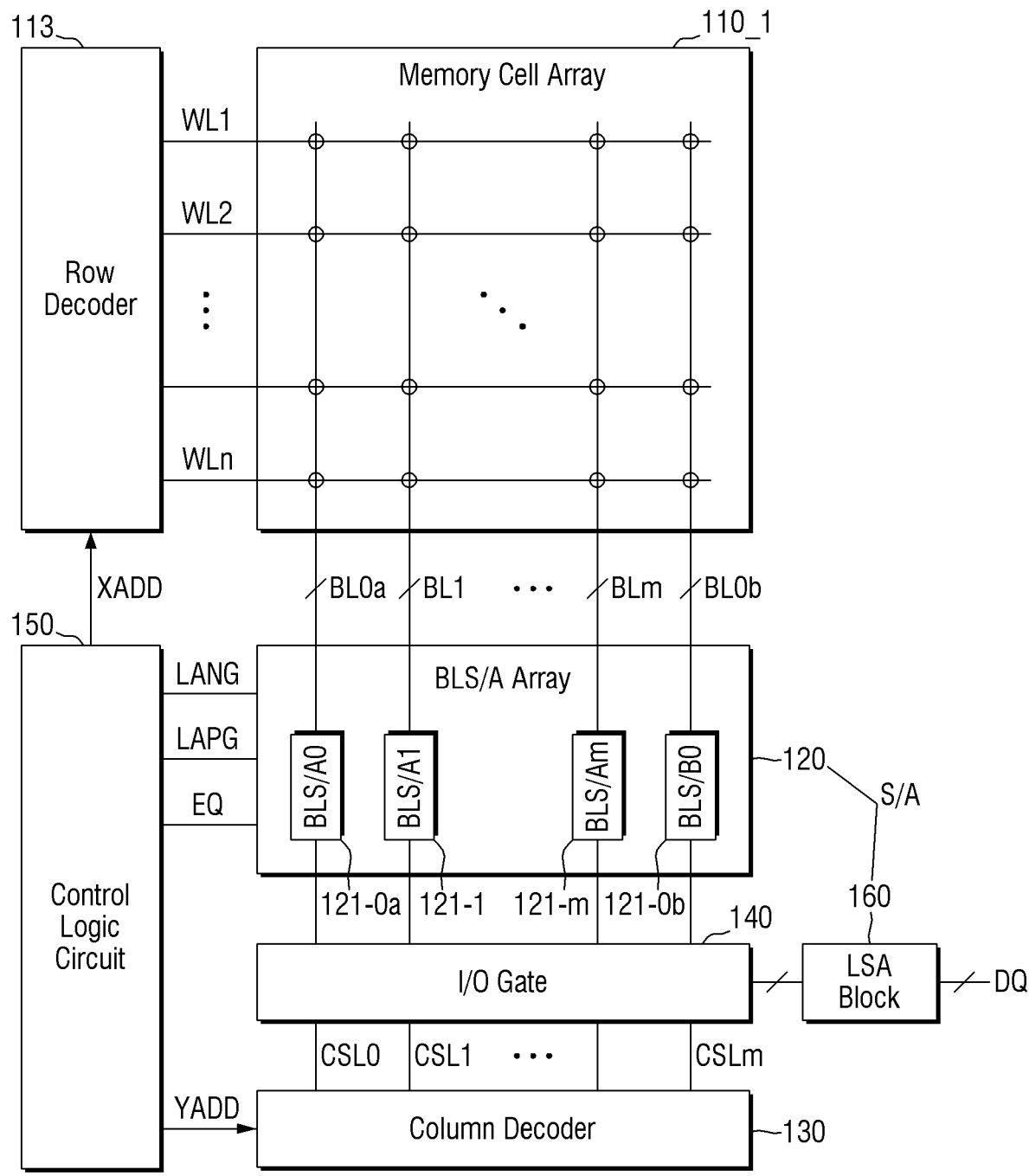
FIG. 3 is a block diagram of a semiconductor memory device according to some embodiments of the present disclosure.

FIG. 3 is a block diagram of a semiconductor memory device according to some embodiments of the present disclosure. FIG. 3 includes some conventional features of a semiconductor memory device, which are a basis for discussion of the present inventive concepts presented herein.

Figure 4:
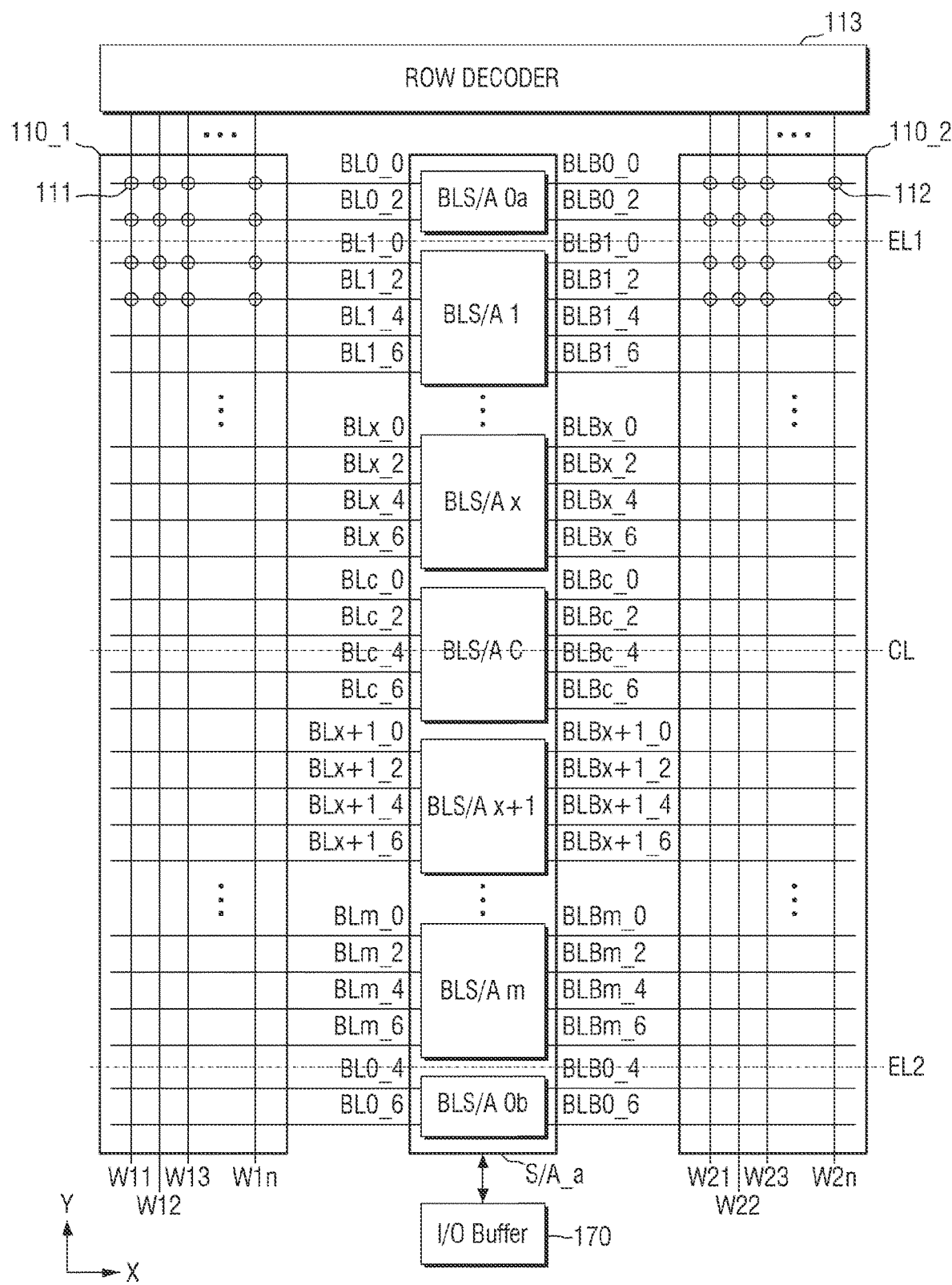
FIG. 4 illustrates the connections of bitline sense amplifiers of FIG. 3.

Referring to FIG. 3 and FIG. 4, a semiconductor memory device 100 may include a first memory cell array 110_1, a second memory cell array 110_2, a row decoder 113, a bitline sense amplifier array 120, a column decoder 130, an I/O gate 140, a control logic circuit 150, a local sense amplifier 160, and an I/O buffer 170.

The first memory cell array 110_1 may include a plurality of first memory cells 111, which are arranged in a matrix of rows and columns. The first memory cells 111 may be connected to a plurality of wordlines (WL1 through WLn where n is a natural number) and a plurality of bitlines (BL0a, BL0b, and BL1 through BLm where m is a natural number). The first memory cells 111 may be classified into normal memory cells or redundant memory cells. Redundant memory cells are used to relieve any defective normal memory cells.

The first memory cells 111 may be implemented as memory cells of a volatile or nonvolatile memory. Here, the volatile memory may be a DRAM, an SRAM, a thyristor RAM (TRAM), a zero-capacitor RAM (Z-RAM), or a twin-transistor RAM (TTRAM).

Here, the nonvolatile memory may be an EEPROM, a flash memory, a magnetic RAM (MRAM), a spin-transfer torque MRAM, a conductive bridging RAM (CBRAM), a ferroelectric RAM (FeRAM), a PRAM, an RRAM, a polymer RAM (PoRAM), a nano floating gate memory (NFGM), a holographic memory, a molecular electronics memory device, or an insulator resistance change memory. Data of one or more bits may be stored in the memory cells of the nonvolatile memory.

The second memory cell array 110_2 is similar to the first memory cell array 110_1, and thus, the description of the first memory cell array 110 may be directly applicable to the second memory cell array 110_2.

The row decoder 113 may decode a row address XADD and may activate a wordline corresponding to the row address XADD. During the activation of a wordline, i.e., a wordline enable operation, a high power supply voltage VPP, which is higher than a power supply voltage VDD, may be applied to the gates of access transistors of memory cells.

The bitline sense amplifier array 120 includes an array of a plurality of bitline sense amplifiers (121-0a, 121-0b, and 121-1 through 121-m). The bitline sense amplifiers (121-0a, 121-0b, and 121-1 through 121-m) sense and amplify data output from the first memory cells 111. An arbitrary bitline sense amplifier, for example, the sense amplifier 121-1, may be connected to a bitline pair including a bitline and a complementary bitline to sense and amplify the electric potential in the bitline BL1. It will be described later with reference to FIG. 4 how to connect the bitline sense amplifiers (121-0a, 121-0b, and 121-1 through 121-m) and bitline pairs.

Each of the bitline sense amplifiers (121-0a, 121-0b, and 121-1 through 121-m) may be a cross-coupled differential sense amplifier including a P-type sense amplifier and an N-type sense amplifier.

The bitline sense amplifiers (121-0a, 121-0b, and 121-1 through 121-m), which are circuit elements that operate normally during the operation of the semiconductor memory device 100, are differentiated from dummy sense amplifiers implemented in a region other than the region where the bitline sense amplifier 120 is implemented.

The column decoder 130 may generate a plurality of column selection signals (CSL1 through CSLm) by decoding a column address YADD.

A plurality of column selection transistors may transmit the electric potential output from the bitline sense amplifiers (121-0a, 121-0b, and 121-1 through 121-m) to the local sense amplifier 160 in response to the column selection signals (CSL1 through CSLm) and may be disposed in the region where the bitline sense amplifiers (121-0a, 121-0b, and 121-1 through 121-m) are disposed.

That is, a plurality of pairs of column selection transistors may be connected to a plurality of bitline pairs to drive the electric potential output from the bitline sense amplifiers (121-0a, 121-0b, and 121-1 through 121-m) to an I/O terminal pair of the local sense amplifier 160. The local sense amplifier 160 may provide or receive data DQ of multiple bits to or from the I/O buffer 170.

The bitline sense amplifier array 120 and the local sense amplifier 160 may form a sense amplifier S/A for the first memory cell array 110_1. The column selection transistors may be disposed in the sense amplifier S/A.

The control logic circuit 150 may receive commands, addresses, and write data from a processor or a memory controller. The control logic circuit 150 may generate various control signals (e.g., "XADD", "YADD", "LANG", "LAPG", and "EQ") for an access operation for the first memory cell array 110_1, such as a write or read operation, in response to a command or an address.

FIG. 4 is a block diagram illustrating connections of the bitline sense amplifiers of FIG. 3.

Referring to FIG. 4, an a-th sense amplifier S/A_a may be part of the sense amplifier S/A of FIG. 3 and may be applicable to nearly all types of volatile or nonvolatile memory devices that use an open bitline sense amplifier scheme.

The a-th sense amplifier S/A_a may be connected to even-numbered bitlines (BL0_0 through BLm_6 where m is a natural number) of the first memory cell array 110_1, and even-numbered complementary bitlines (BLB0_0 through BLBm_6 where m is a natural number) of the second memory cell array 110_2, which provide signals that are complementary to signals provided by the even-numbered bitlines (BL0_0 through BLm_6).

During a sensing operation of a bitline sense amplifier, the electric potential of a complementary bitline BLB may become low when the electric potential of a bitline BL is high. On the contrary, the electric potential of the complementary bitline BLB may become high when the electric potential of the bitline BL is low.

Figure 7:
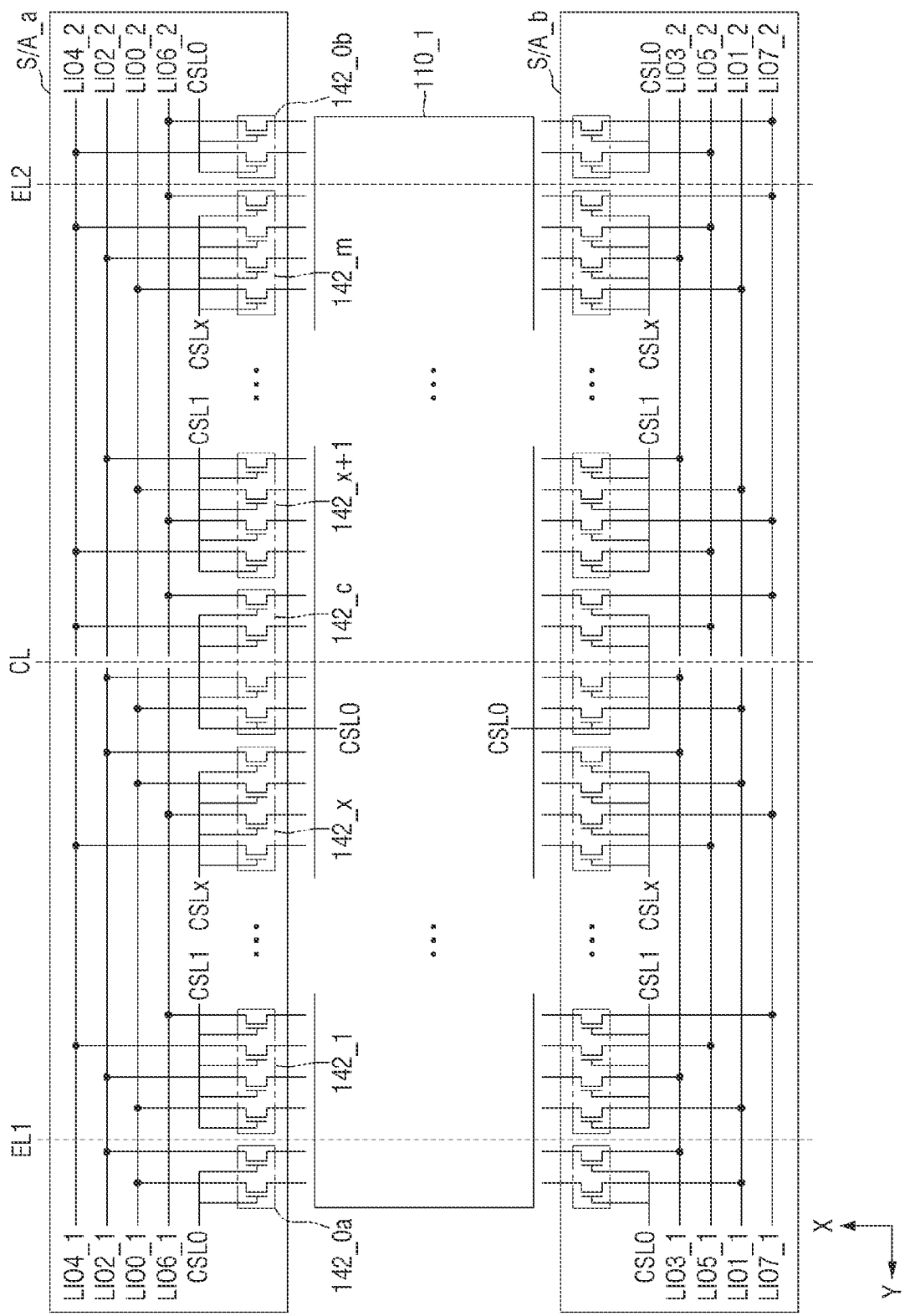
FIG. 7 is a circuit diagram illustrating connections of column selection transistors and local input/output (I/O) lines of a semiconductor memory device according to some embodiments of the present disclosure.

Although not specifically illustrated, odd-numbered bitlines (BL0_1 through BLm_7) of the first memory cell array 110_1 may extend in the opposite direction of a first direction X and may be connected to a b-th sense amplifier S/A b of FIG. 7.

The a-th sense amplifier S/A_a may include a (0-a)-th bitline sense amplifier "BLS/A 0a", first through x-th bitline sense amplifiers "BLS/A 1" through "BLS/A x", a central bitline sense amplifier "BLS/A C", (x+1)-th through m-th bitline sense amplifiers "BLS/A x+1" through "BLS/A m", and a (0_b)-th bitline sense amplifier "BLS/A 0b".

The (0_a)-th bitline sense amplifier "BLS/A 0a", the first through x-th bitline sense amplifiers "BLS/A 1" through "BLS/A x", the central bitline sense amplifier "BLS/A C", the (x+1)-th through m-th bitline sense amplifiers "BLS/A x+1" through "BLS/A m", and the (0_b)-th bitline sense amplifier "BLS/A 0b" may be sequentially arranged in the opposite direction of a second direction Y, between the first and second memory cell arrays 110_1 and 110_2, which are spaced apart from each other in the first direction X.

The (0_a)-th bitline sense amplifier "BLS/A 0a", (0_0)-th and (0_2)-th bitlines BL0_0 and BL0_2, and (0_0)-th and (0_2)-th complementary bitlines BLB0_0 and BLB0_2 may be disposed outside a first outer line EL1, which extends in the first direction X over the first and second memory cell arrays 110_1 and 110_2 along edges of the first and second memory cell arrays 110_1 and 110_2.

The (0_0)-th and (0_2)-th bitlines BL0_0 and BL0_2 extend in the first direction X over the first memory cell array 110_1, and the (0_0)-th bitline BL0_0 is farthest apart from a center line CL, which extends in the first direction X to pass through the centers of the first and second memory cell arrays 110_1 and 110_2, in the second direction Y. The (0_2)-th bitline BL0_2 may be disposed closest to the (0_0)-th bitline BL0_0 in the second direction Y, and thus, the (0_0)-th and (0_2)-th bitlines BL0_0 and BL0_2 may also be referred to as outer bitlines.

The (0_0)-th and (0_2)-th complementary bitlines BLB0_0 and BLB0_2 extend in the first direction X over the first memory cell array 110_1, and the (0_0)-th complementary bitline BLB0_0 is farthest apart from the center line CL in the second direction Y. The (0_2)-th complementary bitline BLB0_2 may be disposed closest to the (0_0)-th complementary bitline BLB0_0 in the second direction Y, and thus, the (0_0)-th and (0_2)-th complementary bitlines BLB0_0 and BLB0_2 may also be referred to as outer complementary bitlines.

The first through x-th bitline sense amplifiers "BLS/A 1" through "BLS/A x" may be sequentially arranged in the opposite direction of the second direction Y, between the first outer line EL1 and the center line CL. (1_0)-th through (x_6)-th bitlines BL1_0 through BLx_6 are disposed between the first outer line EL1 and the center line CL and extend in the first direction X over the first memory cell array 110_1.

The (1_0)-th through (x_6)-th bitlines BL1_0 through BLx_6 may be sequentially arranged in the opposite direction of the second direction Y, between the first outer line EL1 and the center line CL. For example, the (1_0)-th through (1_6)-th bitlines BL1_0 through BL1_6 may be connected to the first bitline sense amplifier "BLS/A 1", and the (x_0)-th through (x_6)-th bitlines BLx_0 through BLx_6 may be connected to the x-th bitline sense amplifier "BLS/A x".

(1_0)-th through (x_6)-th complementary bitlines BLB1_0 through BLBx_6 are disposed between the first outer line EL1 and the center line CL and extend in the first direction X over the second memory cell array 110_2.

The (1_0)-th through (x_6)-th complementary bitlines BLB1_0 through BLBx_6 may be sequentially arranged in the opposite direction of the second direction Y, between the first outer line EL1 and the center line CL. For example, the (1_0)-th through (1_6)-th complementary bitlines BLB1_0 through BLB1_6 may be connected to the first bitline sense amplifier "BLS/A 1", and the (x_0)-th through (x_6)-th complementary bitlines BLBx_0 through BLBx_6 may be connected to the x-th bitline sense amplifier "BLS/A x".

The central bitline sense amplifier "BLS/A C" may be disposed to intersect the center line CL in a plan view. Zeroth through sixth central bitlines BLc_0 through BLc_6 may extend in the first direction X over the first memory cell array 110_1 and may be disposed closest to the center line CL in the second direction Y. Thus, the zeroth through sixth central bitlines BLc_0 through BLc_6 may also be referred to as central bitlines.

Zeroth through sixth central complementary bitlines BLBc_0 through BLBc_6 may extend in the first direction X over the second memory cell array 110_2 and may be disposed closest to the center line CL in the second direction Y. Thus, the zeroth through sixth central complementary bitlines BLBc_0 through BLBc_6 may also be referred to as central complementary bitlines.

The (x+1)-th through m-th bitline sense amplifiers "BLS/A x+1" through "BLS/A m" and the (0_b)-th bitline sense amplifier "BLS/A 0b" may correspond to the first through x-th bitline sense amplifiers "BLS/A 1" through "BLS/A x" and the (0_a)-th bitline sense amplifier "BLS/A 0a", respectively, (x+1_0)-th through (m 6)-th bitlines BLx+1_0 through BLm_6, (x+1_0)-th through (m_6)-th complementary bitlines BLBx+1_0 through BLBm_6, (0_4)-th and (0_6)-th bitlines BL0_4 and BL0_6, and (0_4)-th through (0_6)-th complementary bitlines BLB0_4 and BLB0_6 may correspond to (1_0)-th through (x_6)-th bitlines BL1_0 through BLx_6, (1_0)-th through (x_6)-th complementary bitlines BLB1_0 through BLBx_6, (0_0)-th and (0_2)-th bitlines BL0_0 and BL0_2, and (0_0)-th through (0_2)-th complementary bitlines BLB0_0 and BLB0_2, respectively, and the first outer line EL1 may correspond to a second outer line EL2. Thus, the descriptions of the (x+1)-th through m-th bitline sense amplifiers "BLS/A x+1" through "BLS/A m", the (0_b)-th bitline sense amplifier "BLS/A 0b", the (x+1_0)-th through (m_6)-th bitlines BLx+1_0 through BLm_6, the (x+1_0)-th through (m_6)-th complementary bitlines BLBx+1_0 through BLBm_6, the (0_4)-th and (0_6)-th bitlines BL0_4 and BL0_6, the (0_4)-th through (0_6)-th complementary bitlines BLB0_4 and BLB0_6, and the first outer line EL1 may be directly applicable to the first through x-th bitline sense amplifiers "BLS/A 1" through "BLS/A x", the (0_a)-th bitline sense amplifier "BLS/A 0a", the (1_0)-th through (x_6)-th bitlines BL1_0 through BLx_6, the (1_0)-th through (x_6)-th complementary bitlines BLB1_0 through BLBx_6, the (0_0)-th and (0_2)-th bitlines BL0_0 and BL0_2, the (0_0)-th through (0_2)-th complementary bitlines BLB0_0 and BLB0_2, and the second outer line EL2.

The row decoder 113 may decode a row address, may selectively drive one of a plurality of wordlines W11 through W1n, which are implemented in the first memory cell array 110_1, in accordance with the result of the decoding, and may connect the first memory cells 111 to the a-th sense amplifier S/A_a through the driven wordline.

Optionally, the row decoder 113 may decode a row address, may selectively drive one of a plurality of wordlines W21 through W2n, which are implemented in the second memory cell array 110_2, in accordance with the result of the decoding, and may connect second memory cells 112 to the a-th sense amplifier S/A_a through the driven wordline and a complementary bitline.

During a read operation, the a-th sense amplifier S/A_a may output the electric potential corresponding to read data DQ to the I/O buffer 170 under the control of column selection transistors that will be described later, and the I/O buffer 170 may provide the output read data DQ to the memory controller 200.

Figure 5:
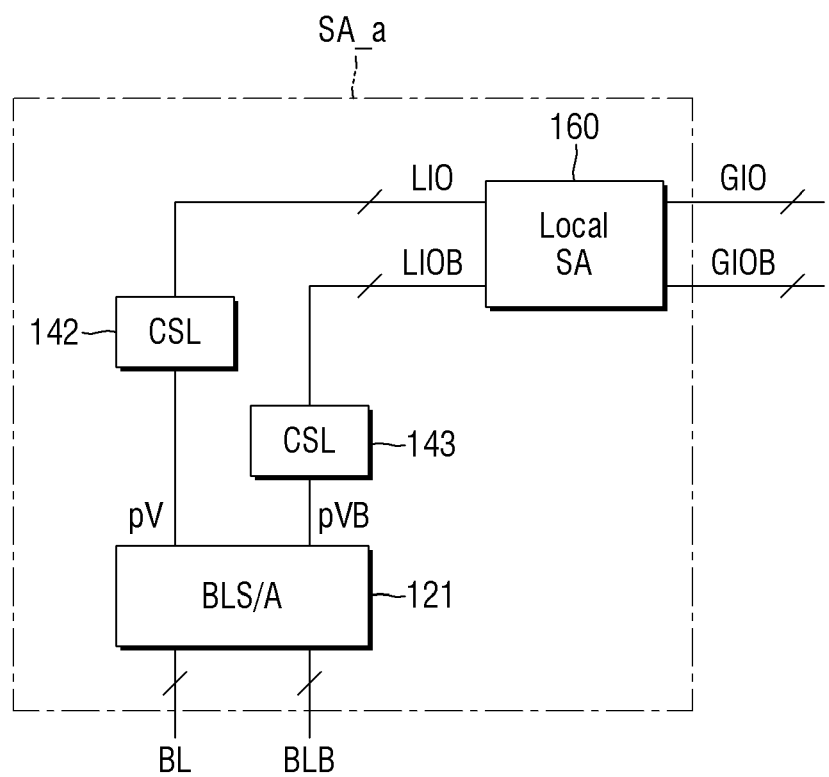
FIG. 5 illustrates a data output path of one of the bitline sense amplifiers of FIG. 4.

FIG. 5 illustrates a data output path of one of the bitline sense amplifiers of FIG. 4. FIG. 5 includes some conventional features of a sense amplifier, which are a basis for discussion of the present inventive concepts presented herein.

Specifically, FIG. 5 illustrates an output path between one bitline sense amplifier 121 and the local sense amplifier 160. The local sense amplifier 160 amplifies electric potential differences pV and pVB, which are provided by the bitline sense amplifier 121 to a local I/O line pair (LIO and LIOB), and outputs the amplified electric potential differences pV and pVB to a global I/O line pair (GIO and GIOB). The global I/O line pair (GIO and GIOB) may be connected to the I/O buffer 170 of FIG. 4, which buffers the input and output of data, and may thus provide data stored in memory cells to the I/O buffer 170 through the global I/O line pair (GIO and GIOB).

A bitline pair (BL and BLB) to which the bitline sense amplifier 121 is connected is connected to the local I/O line pair (LIO and LIOB) through a column selection transistor pair (142 and 143). A first column selection transistor 142 electrically connects a bitline BL and a local I/O line LIO. A second column selection transistor 143 electrically connects a complementary bitline BLB and a complementary local I/O line LIOB.

Figure 6:
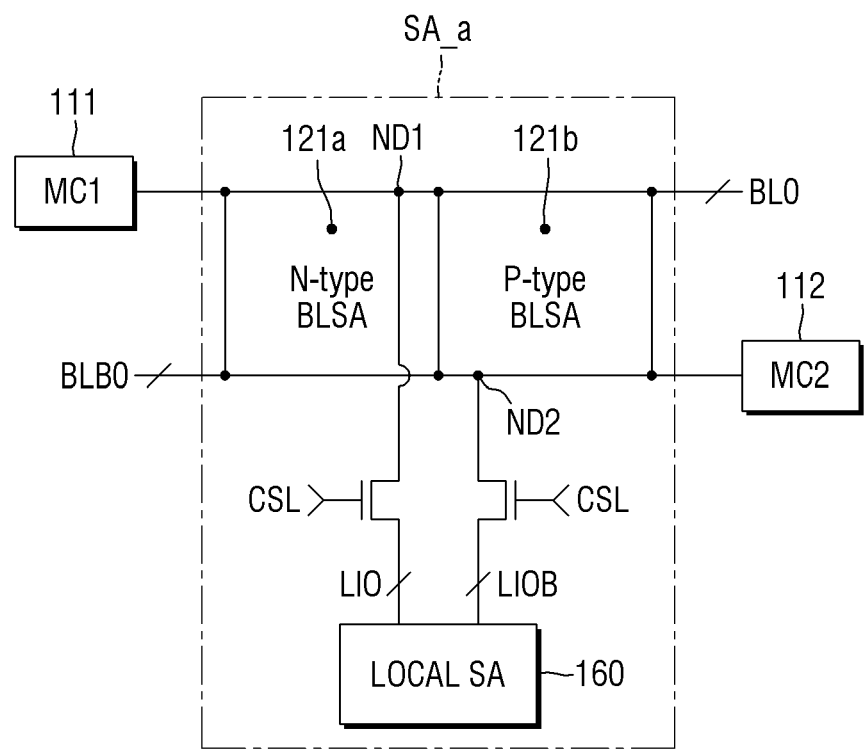
FIG. 6 illustrates the layout of the bitline sense amplifier of FIG. 5.

FIG. 6 illustrates the layout of the bitline sense amplifier of FIG. 5. FIG. 6 includes some conventional features of a sense amplifier, which are a basis for discussion of the present inventive concepts presented herein.

Referring to FIG. 6, a folded-type bitline sense amplifier SA_a may include an N-type sense amplifier 121a and a P-type sense amplifier 121b.

The first and second column selection transistors 142 and 143 may be implemented as N-type metal-oxide semiconductor (NMOS) transistors and may be driven by a column selection signal CSL.

Although not specifically illustrated, the semiconductor memory device 100 may include a precharge-and-equalization part, which precharges a bitline pair (BL0 and BLB0) between a first memory cell 111 and the N-type sense amplifier 121a and between a second memory cell 112 and the P-type sense amplifier 121b to a precharge voltage and equalizes the bitline pair (BL0 and BLB0) to an equal electric potential.

In the a-th sense amplifier S/A_a of FIG. 6, the second memory cell 112 is not accessed when the first memory cell 111 is accessed. During a sensing operation of the bitline sense amplifier S/A_a, the electric potential of the complementary bitline BLB0 becomes low when the electric potential of the bitline BL0 is high. On the contrary, during the sensing operation of the a-th sense amplifier S/A_a, the electric potential of the complementary bitline BLB0 becomes high when the electric potential of the bitline BL0 is low.

Figure 8:
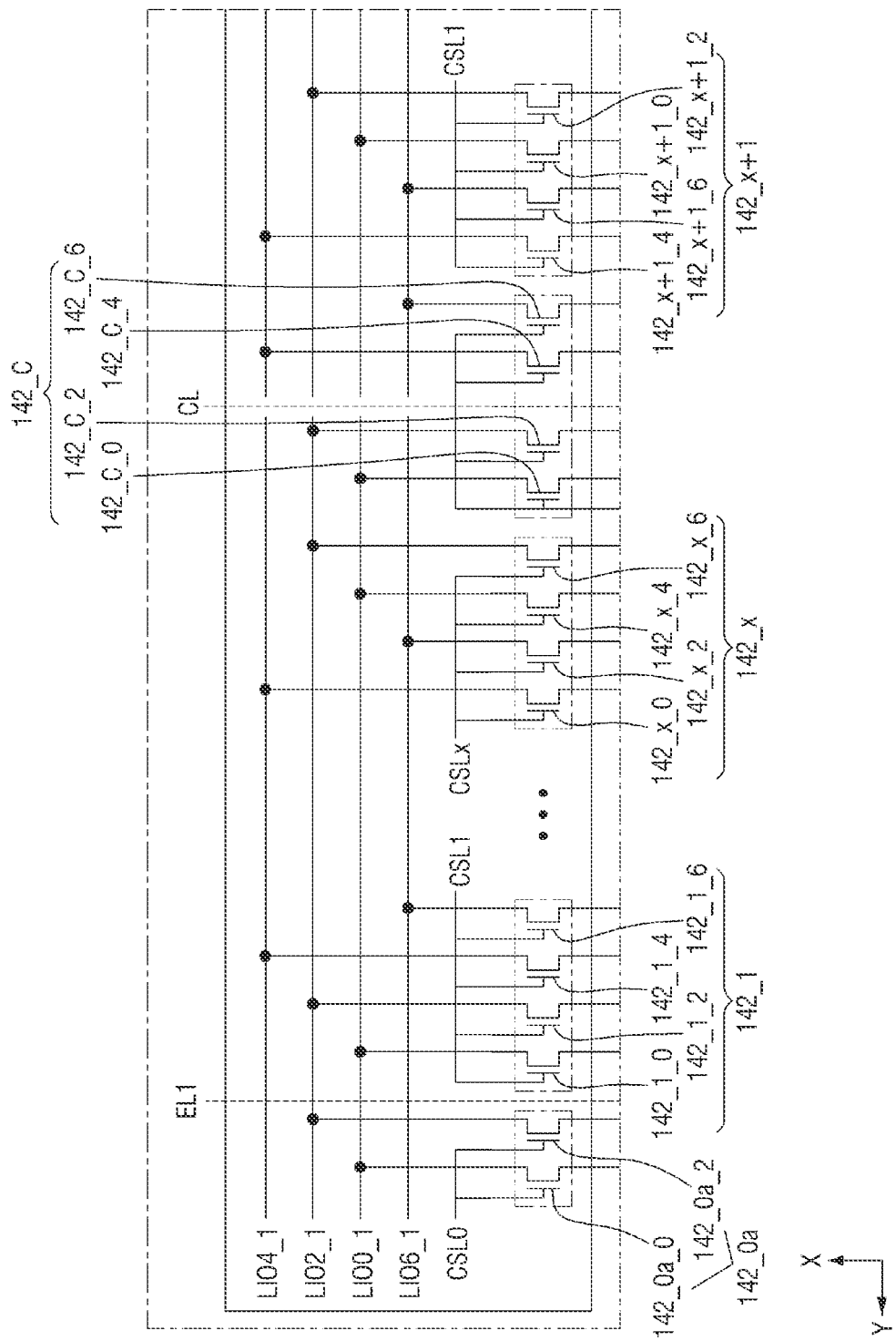
FIG. 8 is a detailed circuit diagram of the semiconductor memory device of FIG. 7.

FIG. 7 is a circuit diagram illustrating connections of column selection transistors and local I/O lines of a semiconductor memory device according to some embodiments of the present disclosure. FIG. 8 is a detailed circuit diagram of the semiconductor memory device of FIG. 7.

Referring to FIGS. 7 and 8, (0_1)-th through (6_1)-th local I/O lines LIO0_1 through LI06_1 and (0_2)-th through (6_2)-th local I/O lines LIO0_2 through LI06_2 extend in the second direction Y over the a-th sense amplifier S/A_a, and the (0_1)-th through (6_1)-th local I/O lines LIO0_1 through LI06_1 are spaced apart from the (0_2)-th through (6_2)-th local I/O lines LIO0_2 through LI06_2, respectively, with respect to the center line CL.

(1_1)-th through (7_1)-th local I/O lines LIO1_1 through LI07_1 and (1_2)-th through (7_2)-th local I/O lines LIO1_2 through LI07_2 extend in the second direction Y over the b-th sense amplifier S/A b, and the (1_1)-th through (7_1)-th local I/O lines LIO1_1 through L107_1 are spaced apart from the (1_2)-th through (7_2)-th local I/O lines LIO1_2 through L107_2, respectively, with respect to the center line CL.

The I/O buffer 170 can input data to, and output data from, the first memory cell array 110_1 in units of 16 bits through the arrangement of 16 local I/O lines and zeroth through m-th column selection signals CSL0 through CSLm.

The a-th sense amplifier S/A_a may include a plurality of (0_a)-th column selection transistors 142_0a, a plurality of first column selection transistors 142_1, . . . , a plurality of x-th column selection transistors 142_x, a plurality of central column selection transistors 142_c, a plurality of (x+1)-th column selection transistors 142_x+1, . . . , a plurality of m-th column selection transistors 142_m, and a plurality of (0_b)-th column selection transistors 142_0b.

The (0_a)-th column selection transistors 142_0a include (0_0)-th and (0_2)-th column selection transistors 142_0a_0 and 142_0a_2. The (0_0)-th and (0_2)-th column selection transistors 142_0a_0 and 142_0a_2 may be disposed outside the first outer line EL1 and may be connected to the (0_1)-th and (2_1)-th local I/O lines LIO0_1 and L102_1, respectively.

The first through x-th column selection transistors 142_1 through 142_x are disposed between the first outer line EL1 and the center line CL, and the (1_0)-th through (x_6)-th column selection transistors 142_1_0 through 142_x_6, which are include in the first through x-th column selection transistors 142_1 through 142_x, respectively, are connected to the (0_1)-th through (6_1)-th local I/O lines LIO0_1 through L106_1, respectively. In one example, the (1_0)-th and (x_0)-th column selection transistors 142_1_0 and 142_x_0 may be connected to the (0_1)-th local I/O line LIO0_1, the (1_2)-th and (x_2)-th column selection transistors 142_1_2 and 142_x_2 may be connected to the (2_1)-th local I/O line L102_1, the (1_4)-th and (x_4)-th column selection transistors 142_1_4 and 142_x_4 may be connected to the (4_1)-th local I/O line L104_1, and the (1_6)-th and (x_6)-th column selection transistors 142_1_6 and 142_x_6 may be connected to the (6_1)-th local I/O line L106_1.

The central column selection transistors 142_c include zeroth through sixth central column selection transistors 142_C_0 through 142_C_6, the zeroth and second central column selection transistors 142_C_0 and 142_C_2 are disposed between the first outer line EL1 and the center line CL, and the fourth and sixth central column selection transistors 142_C_4 and 142_C_6 are disposed between the center line CL and the second outer line EL2.

The zeroth and second central column selection transistors 142_C_0 and 142_C_2 are connected to the (0_1)-th and (2_1)-th local I/O lines LIO0_1 and L102_1, respectively.

The (0_b)-th column selection transistors 142_0b and the (x+1)-th column selection transistors 142_x+1, ..., the m-th column selection transistors 142_m correspond to the (0_a)-th column selection transistors 142_0a and the first column selection transistors 142_1, ..., the x-th column selection transistors 142_x, respectively, the (0_2)-th through (6_2)-th local I/O lines LIO0_2 through L106_2 correspond to the (0_1)-th through (6_1)-th local I/O lines LIO0_1 through L106_1, respectively, and the second outer line EL2 corresponds to the first outer line EL1. Thus, the descriptions of the (0_a)-th column selection transistors 142_0a, the first column selection transistors 142_1, ..., the x-th column selection transistors 142_x, the (0_1)-th through (6_1)-th local I/O lines LIO0_1 through L106_1, and the first outer line EL1 may be directly applicable to the (0_b)-th column selection transistors 142_0b, the (x+1)-th column selection transistors 142_x+1, ..., the m-th column selection transistors 142_m, the (0_2)-th through (6_2)-th local I/O lines LIO0_2 through L106_2, and the second outer line EL2.

A plurality of column selection transistors share one local I/O line. However, the zeroth column selection signal CSL0 may be provided to the (0_a)-th column selection transistors 142_0a, the (0_b)-th column selection transistors 142_0b, and the central column selection transistors 142_c, the first column selection signal CSL1 may be provided to the first column selection transistors 142_1 and the (x+1)-th column selection transistors 142_x+1, and the x-th column selection signal CSLx may be provided to the m-th column selection transistors 142_m, and if the zeroth through x-th column selection signals CSL0 through CSLx are selectively input by the column decoder 130 so that the data DQ can be prevented from being input or output while being overlapped, data can be input and output in units of 16 bits.

Accordingly, the (0_a)-th column selection transistors 142_0a and the (0_b)-th column selection transistors 142_0b transmit the electric potential pV to the local sense amplifier 160 while the central column selection transistors 142_c are transmitting the electric potential pV to the local sense amplifier 160.

Figure 9:
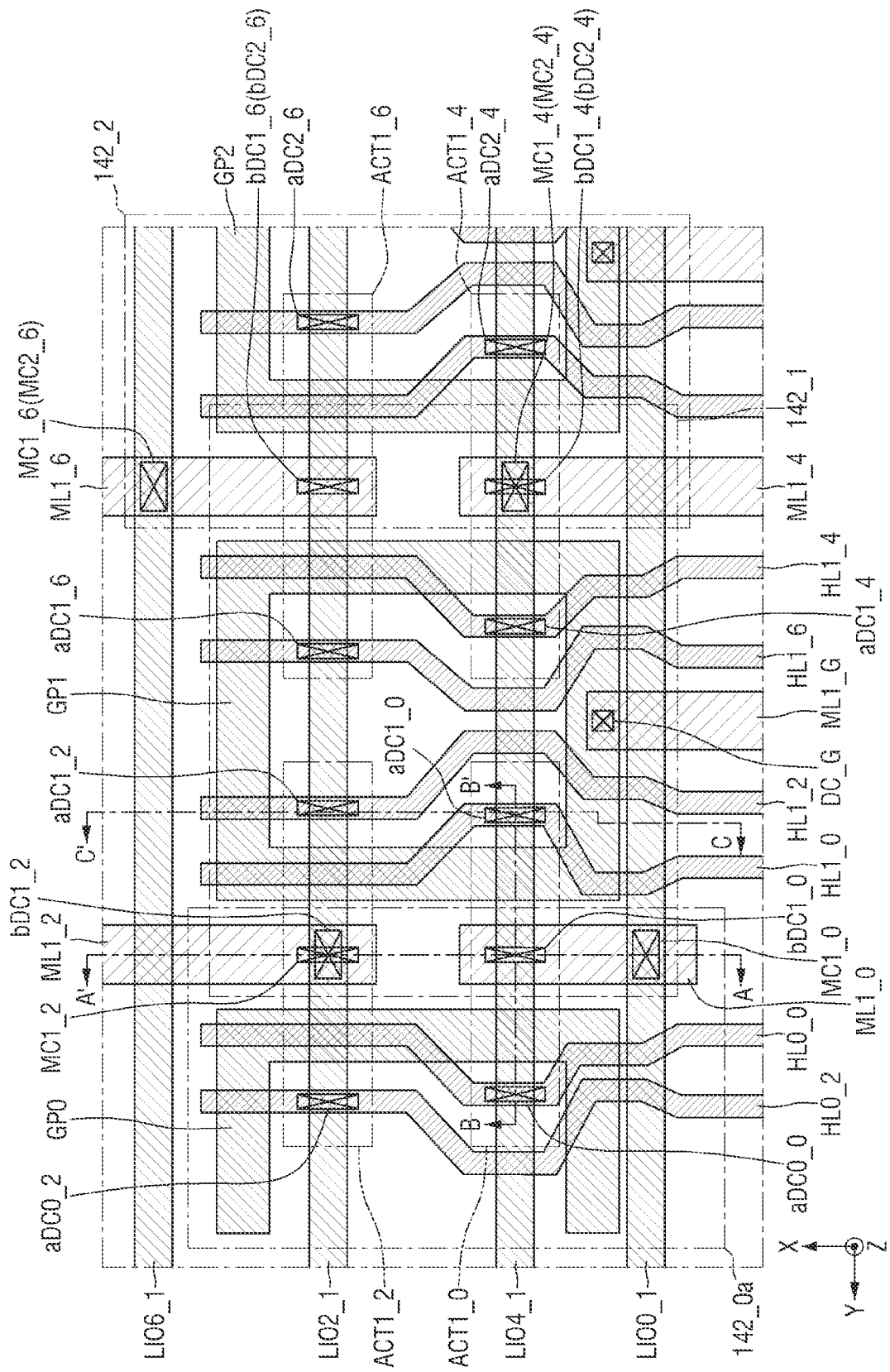
FIG. 9 is a layout view illustrating a plurality of column selection transistors adjacent to a first outer line of FIG. 7.
Figure 10:
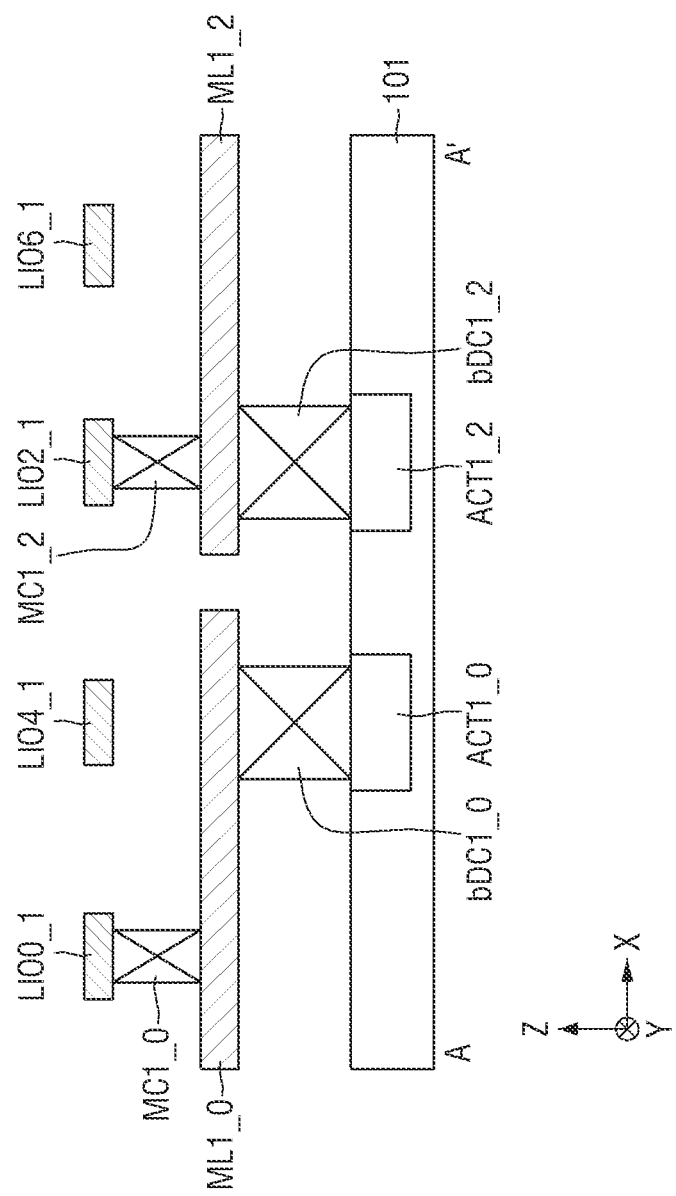
FIG. 10 is a cross-sectional view taken along line A-A' of FIG. 9.
Figure 11:
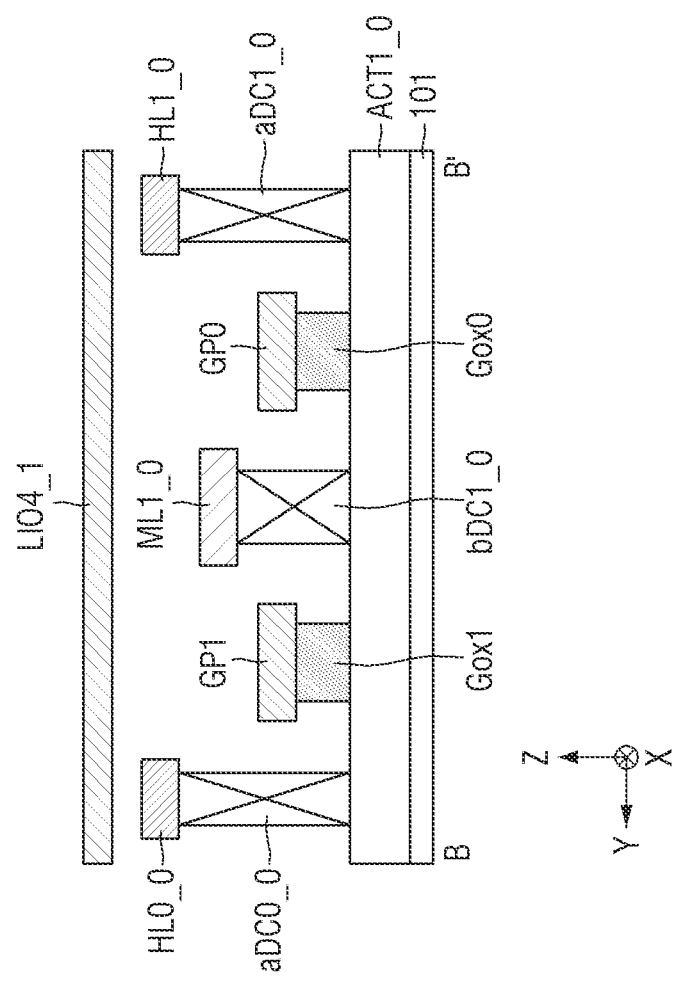
FIG. 11 is a cross-sectional view taken along line B-B' of FIG. 9.
Figure 12:
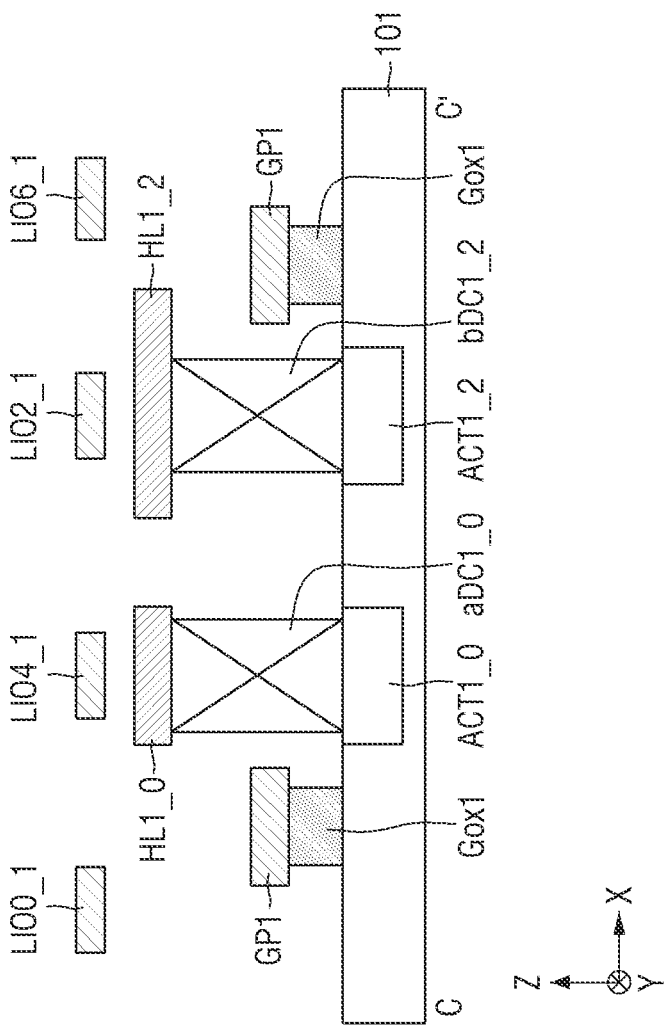
FIG. 12 is a cross-sectional view taken along line C-C' of FIG. 9.
Figure 13:
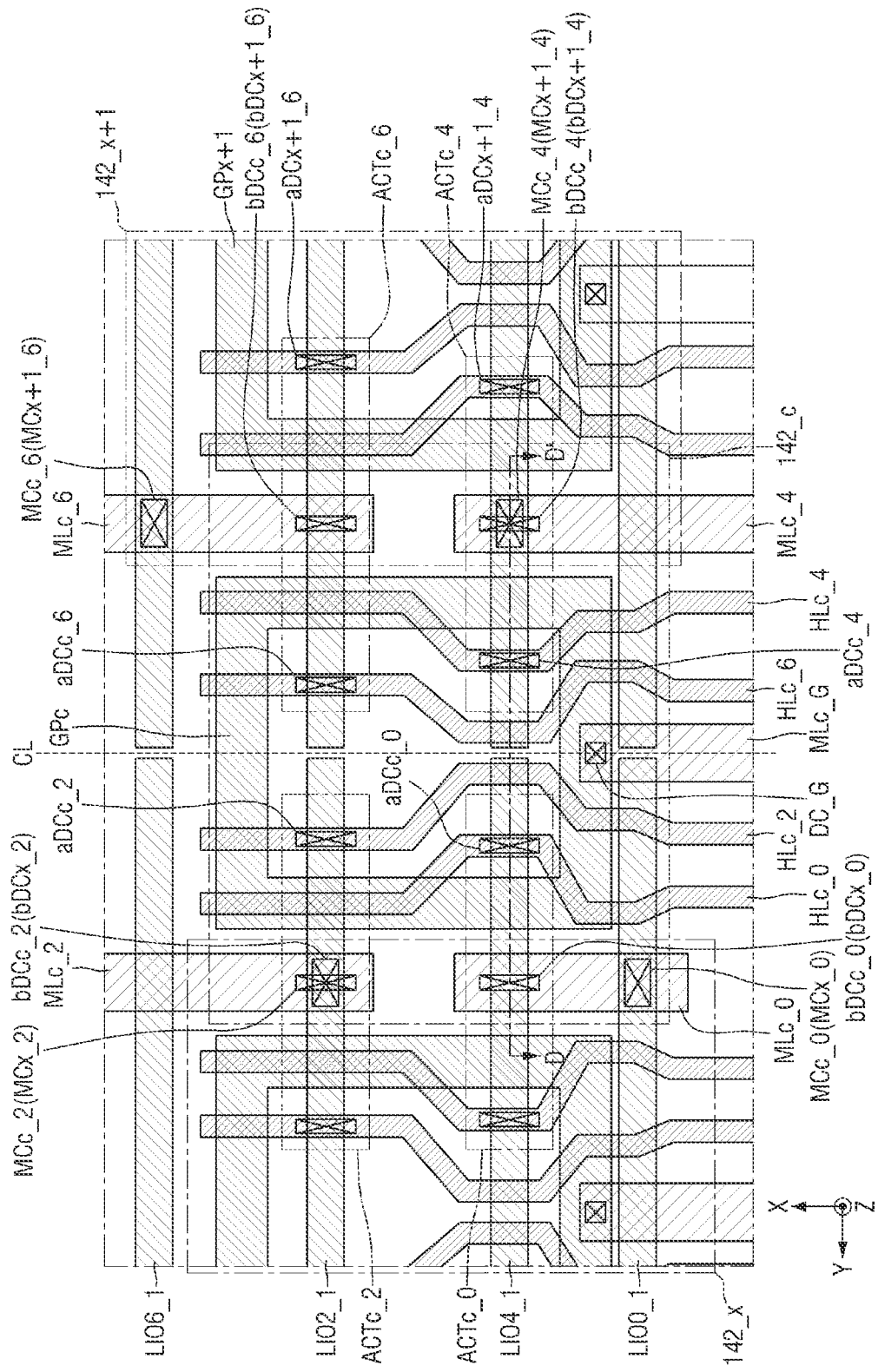
FIG. 13 is a layout view illustrating a plurality of column selection transistors adjacent to a center line of FIG. 7.
Figure 14:
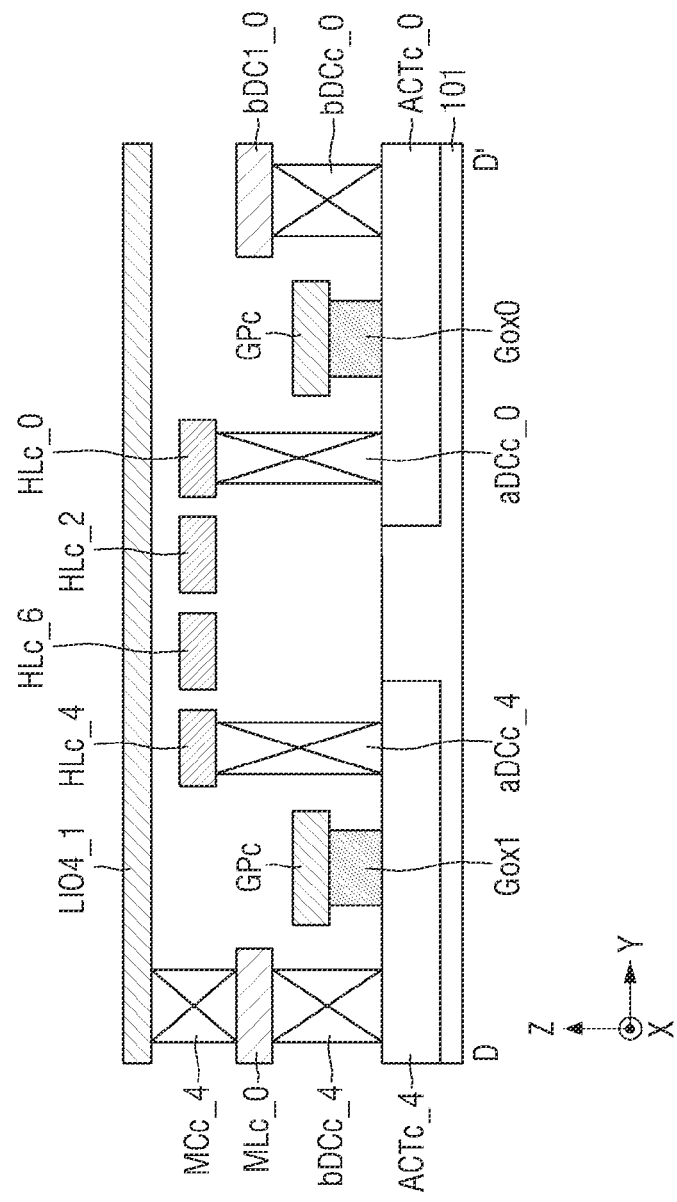
FIG. 14 is a cross-sectional view taken along line D-D' of FIG. 13.

FIG. 9 is a layout view illustrating a plurality of column selection transistors adjacent to the first outer line of FIG. 7. FIG. 10 is a cross-sectional view taken along line A-A' of FIG. 9. FIG. 11 is a cross-sectional view taken along line B-B' of FIG. 9. FIG. 12 is a cross-sectional view taken along line C-C' of FIG. 9. FIG. 13 is a layout view illustrating a plurality of column selection transistors adjacent to the center line of FIG. 7. FIG. 14 is a cross-sectional view taken along line D-D' of FIG. 13.

Referring to FIGS. 7 through 14, the a-th sense amplifier S/A_a may include (1_0)-th through (1_6)-th active areas ACT1_0 through ACT1_6, zeroth through sixth central active areas ACTc_0 through ACTc_6, zeroth through second gate patterns GP0 through GP2, a central gate pattern GPc, an (x+1)-th gate pattern GPx+1, a plurality of a-type direct contacts (aDC0_0 through aDC0_x+1), a plurality of b-type direct contacts (bDC1_0 through bDCc_6), a plurality of metal contacts (MC1_0 through MCc_6), a plurality of middle conducting lines (ML1_0 through MLc_6), a plurality of upper conducting lines (HL0_0 through HLc_6), (0_1)-th through (6_1)-th local I/O lines LIO0_1 through L106_1, and (0_2)-th through (6_2)-th local I/O lines LIO0_2 through LIO6_2.

The (1_0)-th through (1_6)-th active areas ACT1_0 through ACT1_6 extend in the second direction Y as bars, the (1_0)-th and (1_4)-th active areas ACT1_0 and ACT1_4 are arranged in the second direction Y, the (1_2)-th and (1_6)-th active areas ACT1_2 and ACT1_6 are arranged in the second direction Y, the (1_0)-th and (1_2)-th active areas ACT1_0 and ACT1_2 are spaced apart from each other in the first direction X, and the (1_4)-th and (1_6)-th active areas ACT1_4 and ACT1_6 are spaced apart from each other in the first direction X. The first outer line EL1 intersects the (1_0)-th and (1_2)-th active areas ACT1_0 and ACT1_2 in a plan view.

The zeroth through sixth central active areas ACTc_0 through ACTc_6 extend in the second direction Y as bars, the zeroth and fourth active areas ACTc_0 and ACTc_4 are arranged in the second direction Y, the second and sixth active areas ACTc_2 and ACTc_6 are arranged in the second direction Y, the zeroth and second active areas ACTc_0 and ACTc_2 are spaced apart from each other in the first direction X, and the fourth and sixth active areas ACTc_4 and ACTc_6 are spaced apart from each other in the first direction X. The center line CL may pass between the second and sixth central active areas ACTc_2 and ACTc_6 in a plan view.

The zeroth gate pattern GP0 is disposed outside the first outer line EL1 in the second direction Y and has an angle L shape. At least part of the zeroth gate pattern GP0 is disposed to overlap with the (1_0)-th and (1_2)-th active areas ACT1_0 and ACT1_2 in a plan view.

The first gate pattern GP1 is disposed adjacent to the zeroth gate pattern GP0 in the second direction Y and has a closed rectangular loop shape. At least part of the first gate pattern GP1 is disposed to overlap with the (1_0)-th through (1_6)-th active areas ACT1_0 through ACT1_6 in a plan view.

The second gate pattern GP2 is disposed adjacent to the first gate pattern GP1 in the second direction Y and has a closed rectangular loop shape. At least part of the second gate pattern GP2 is disposed to overlap with the (1_4)-th and (1_6)-th active areas ACT1_4 through ACT1_6 in a plan view.

The central gate pattern GPc is disposed to overlap with the center line CL in a plan view, and the zeroth through second gate patterns GP0 through GP0 are arranged in the second direction Y and have a closed rectangular loop shape. At least part of the central gate pattern GPc is disposed to overlap with the zeroth through sixth central active areas ACTc_0 through ACTc_6 in a plan view.

The (x+1)-th gate pattern GPx+1 is arranged adjacent to the central gate pattern GPc in the second direction Y and has a closed rectangular loop shape. At least part of the (x+1)-th gate pattern GPx+1 is disposed to overlap with the fourth and sixth central active areas ACTc_4 and ACTc_6.

The a-type direct contacts (aDC0_0 through aDC0_x+1) electrically connect active areas (ACT1_0 through ACT1_6 and ACTc_0 through ACTc_6) and the upper conducting lines (HL0_0 through HLc_6). The bitline sense amplifier 120 (of FIG. 5) may provide the electric potential pV to the active areas (ACT1_0 through ACT1_6 and ACTc_0 through ACTc_6) through the upper conducting lines (HL0_0 through HLc_6).

A (0_0)-th a-type direct contact aDC0_0 is disposed on the (1_0)-th active area ACT1_0 and electrically connects the (1_0)-th active area ACT1_0 and a (0_0)-th upper conducting line HL0_0. A (0_2)-th a-type direct contact aDC0_2 is disposed on the (1_2)-th active area ACT1_2 and electrically connects the (1_2)-th active area ACT1_2 and a (0_2)-th upper conducting line HL0_2.

A (1_0)-th a-type direct contact aDC1_0 is disposed on the (1_0)-th active area ACT1_0 and electrically connects the (1_0)-th active area ACT1_0 and a (1_0)-th upper conducting line HL1_0. A (1_2)-th a-type direct contact aDC1_2 is disposed on the (1_2)-th active area ACT1_2 and electrically connects the (1_2)-th active area ACT1_2 and a (1_2)-th upper conducting line HL1_2. A (1_4)-th a-type direct contact aDC1_4 is disposed on the (1_4)-th active area ACT1_4 and electrically connects the (1_4)-th active area ACT1_4 and a (1_4)-th upper conducting line HL1_4. A (1_6)-th a-type direct contact aDC1_6 is disposed on the (1_6)-th active area ACT1_6 and electrically connects the (1_6)-th active area ACT1_6 and a (1_6)-th upper conducting line HL1_6.

A (2_4)-th a-type direct contact aDC2_4 is disposed on the (1_4)-th active area ACT1_4, and a (2_6)-th a-type direct contact aDC2_6 is disposed on the (1_6)-th active area ACT1_6.

A zeroth a-type central direct contact aDCc_0 is disposed on the zeroth central active area ACTc_0 and electrically connects the zeroth central active area ACTc_0 and a zeroth central upper conducting line HLc_0. A second a-type central direct contact aDCc_2 is disposed on the second central active area ACTc_2 and electrically connects the second central active area ACTc_2 and a second central upper conducting line HLc_2. A fourth a-type central direct contact aDCc_4 is disposed on the fourth central active area ACTc_4 and electrically connects the fourth central active area ACTc_4 and a fourth central upper conducting line HLc_4. A sixth a-type central direct contact aDCc_6 is disposed on the sixth central active area ACTc_6 and electrically connects the sixth central active area ACTc_6 and a sixth central upper conducting line HLc_6.

A (x+1_4)-th a-type direct contact aDCx+1_4 is disposed on the fourth central active area ACTc_4, and a (x+1_6)-th a-type direct contact aDCx+1_6 is disposed on the sixth central active area ACTc_6.

The b-type direct contacts (bDC1_0 through bDCc_6) electrically connect the active areas (ACT1_0 through ACT1_6 and ACTc_0 through ACTc_6) and the middle conducting lines (ML1_0 through MLc_6). Electrical signals may be provided to local I/O lines (LIO0_1 through L106_1 and LIO0_2 through L106_2) through the middle conducting lines (ML1_0 through MLc_6).

A (1_0)-th b-type direct contact bDC1_0 is disposed on the (1_0)-th active area ACT1_0 and electrically connects the (1_0)-th active area ACT1_0 and a (1_0)-th middle conducting line ML1_0. A (1_2)-th b-type direct contact bDC1_2 is disposed on the (1_2)-th active area ACT1_2 and electrically connects the (1_2)-th active area ACT1_2 and a (1_2)-th middle conducting line ML1_1. A (1_4)-th b-type direct contact bDC1_4 is disposed on the (1_4)-th active area ACT1_4 and electrically connects the (1_4)-th active area ACT1_4 and a (1_4)-th upper middle conducting line ML1_4. A (1_6)-th b-type direct contact bDC1_6 is disposed on the (1_6)-th active area ACT1_6 and electrically connects the (1_6)-th active area ACT1_6 and a (1_6)-th middle conducting line ML1_6.

A zeroth b-type central direct contact bDCc_0 is disposed on the zeroth central active area ACTc_0 and electrically connects the zeroth central active area ACTc_0 and a zeroth central middle conducting line MLc_0. A second b-type central direct contact bDCc_2 is disposed on the second central active area ACTc_2 and electrically connects the second central active area ACTc_2 and a second central middle conducting line MLc_2. A fourth b-type central direct contact bDCc_4 is disposed on the fourth central active area ACTc_4 and electrically connects the fourth central active area ACTc_4 and a fourth central middle conducting line MLc_4. A sixth b-type central direct contact bDCc_6 is disposed on the sixth central active area ACTc_6 and electrically connects the sixth central active area ACTc_6 and a sixth central middle conducting line MLc_6.

The metal contacts (MC1_0 through MCc_6) electrically connect the middle conducting lines (ML1_0 through MLc_6) and the local I/O lines (LIO0_1 through L106_1 and LIO0_2 through L106_2). Electrical signals may be provided to the local I/O lines (LIO0_1 through L106_1 and LIO0_2 through L106_2) through the metal contacts (MC1_0 through MCc_6) and the middle conducting lines (ML1_0 through MLc_6).

A (1_0)-th metal contact MC1_0 electrically connects a (1_0)-th middle conducting line ML1_0 and the (0_1)-th local I/O line LIO0_1. A (1_2)-th metal contact MC1_2 electrically connects a (1_2)-th middle conducting line ML1_2 and the (2_1)-th local I/O line L102_1. A (1_4)-th metal contact MC1_4 electrically connects a (1_4)-th middle conducting line ML1_4 and the (4_1)-th local I/O line L104_1. A (1_6)-th metal contact MC1_6 electrically connects a (1_6)-th middle conducting line ML1_4 and the (6_1)-th local I/O line L106_1.

A zeroth central metal contact MCc_0 electrically connects a zeroth central middle conducting line MLc_0 and the (0_1)-th local I/O line LIO0_1. A second central metal contact MCc_2 electrically connects a second central middle conducting line MLc_2 and the (2_1)-th local I/O line L102_1. A fourth central metal contact MCc_4 electrically connects a fourth central middle conducting line MLc_4 and the (4_1)-th local I/O line L104_1. A sixth central metal contact MCc_6 electrically connects a sixth central middle conducting line MLc_6 and the (6_1)-th local I/O line L106_1.

The (0_1)-th through (6_1)-th local I/O lines LIO0_1 through LI06_1 are spaced apart from the (0_2)-th through (6_2)-th local I/O lines LIO0_2 through LI06_2, respectively, with respect to the center line CL and do not intersect the (0_2)-th through (6_2)-th local I/O lines LIO0_2 through LI06_2 in a plan view.

Part of the zeroth gate pattern GP0, the (0_0)-th a-type direct contact aDC0_0, and the (1_0)-th b-type direct contact bDC1_0 form the (0_0)-th column selection transistor 142_0a_0 of FIG. 7 over the (1_0)-th active area ACT1_0. Part of the first gate pattern GP1, the (1_0)-th a-type direct contact aDC1_0, and the (1_0)-th b-type direct contact bDC1_0 form the (1_0)-th column selection transistor 142_1_0 of FIG. 7 over the (1_0)-th active area ACT1_0.

The (0_0)-th and (1_0)-th column selection transistors 142_0a_0 and 142_1_0 share the (1_0)-th b-type direct contact bDC1_0 and the (1_0)-th metal contact MC1_0.

Part of the zeroth gate pattern GP0, the (0_2)-th a-type direct contact aDC0_2, and the (1_2)-th b-type direct contact bDC1_2 form the (0_2)-th column selection transistor 142_0a_2 of FIG. 7 over the (1_2)-th active area ACT1_2. Part of the first gate pattern GP1, the (0_2)-th a-type direct contact aDC0_2, and the (1_2)-th b-type direct contact bDC1_2 form the (1_2)-th column selection transistor 142_1_2 of FIG. 7 over the (1_2)-th active area ACT1_2.

The (0_2)-th and (1_2)-th column selection transistors 142_0a_2 and 142_1_2 share the (1_2)-th b-type direct contact bDC1_2 and the (1_2)-th metal contact MC1_2.

Part of the first gate pattern GP1, the (1_4)-th a-type direct contact aDC1_4, and the (1_4)-th b-type direct contact bDC1_4 form the (1_4)-th column selection transistor 142_1_4 of FIG. 7 over the (1_4)-th active area ACT1_4. Part of the second gate pattern GP2, the (2_4)-th a-type direct contact aDC2_4, and the (1_4)-th b-type direct contact bDC1_4 form the (2_4)-th column selection transistor 142_2_4 of FIG. 7 over the (1_4)-th active area ACT1_4.

The (1_4)-th and (2_4)-th column selection transistors 142_1_4 and 142_2_4 share the (1_4)-th b-type direct contact bDC1_4 and the (1_4)-th metal contact MC1_4.

Part of the first gate pattern GP1, the (1_6)-th a-type direct contact aDC1_6, and the (1_6)-th b-type direct contact bDC1_6 form the (1_6)-th column selection transistor 142_1_6 of FIG. 7 over the (1_6)-th active area ACT1_6. Part of the second gate pattern GP2, the (2_6)-th a-type direct contact aDC2_6, and the (2_6)-th b-type direct contact bDC2_6 form the (2_6)-th column selection transistor 142_2_6 of FIG. 7 over the (1_6)-th active area ACT1_6.

The (1_6)-th and (2_6)-th column selection transistors 142_1_6 and 142_2_6 share the (1_6)-th b-type direct contact bDC1_6 and the (1_6)-th metal contact MC1_6.

Part of the central gate pattern GPc, the zeroth a-type central direct contact aDCc_0, and the zeroth b-type central direct contact bDCc_0 form the zeroth central column selection transistor 142_c_0 of FIG. 7 over the zeroth central active area ACTc_0.

Part of the central gate pattern GPc, the second a-type central direct contact aDCc_2, and the second b-type central direct contact bDCc_2 form the second central column selection transistor 142_c_2 of FIG. 7 over the second central active area ACTc_2.

Part of the central gate pattern GPc, the fourth a-type central direct contact aDCc_4, and the fourth b-type central direct contact bDCc_4 form the fourth central column selection transistor 142_c_4 of FIG. 7 over the fourth central active area ACTc_4. Part of the central gate pattern GPc, the (x+1_4)-th a-type central direct contact aDCx+1_4, and the fourth b-type central direct contact bDCc_4 form the (x+1_4)-th central column selection transistor 142_x+1_4 of FIG. 7 over the fourth central active area ACTc_4.

The fourth central column selection transistor 142_c_4 and the (x+1_4)-th column selection transistor 142_x+1_4 share the fourth b-type central direct contact and the fourth central metal contact MCc_4.

Part of the central gate pattern GPc, the sixth a-type central direct contact aDCc_6, and the sixth b-type central direct contact bDCc_6 form the sixth central column selection transistor 142_c_6 of FIG. 7 over the sixth central active area ACTc_6. Part of the central gate pattern GPc, the (x+1_6)-th a-type central direct contact aDCx+1_6, and the sixth b-type central direct contact bDCc_6 form the (x+1_6)-th central column selection transistor 142_x+1_6 of FIG. 7 over the sixth central active area ACTc_6.

The sixth central column selection transistor 142_c_6 and the (x+1_6)-th central column selection transistor 142_x+1_6 share the sixth b-type central direct contact bDCc_6 and the sixth central metal contact MCc_6.

The zeroth central column selection transistor 142_c_0 and the fourth central column selection transistor 142_c_4 are opposite to each other with respect to the center line CL. The second central column selection transistor 142_c_2 and the sixth central column selection transistor 142_c_6 are opposite to each other with respect to the center line CL.

As gate signals are selectively input to the zeroth and first gate patterns GP0 and GP1, the (0_0)-th and (1_0)-th column selection transistors 142_0a_0 and 142_1_0 are selectively turned on. Thus, the (1_0)-th column selection transistor 142_1_0 is turned off while the (0_0)-th column selection transistor 142_0a_0 is being turned on and transmitting electric potential to the local sense amplifier 160.

As gate signals are selectively input to the zeroth and first gate patterns GP0 and GP1, the (0_2)-th and (1_2)-th column selection transistors 142_0a_2 and 142_1_2 are selectively turned on. Thus, the (1_2)-th column selection transistor 142_1_2 is turned off while the (0_2)-th column selection transistor 142_0a_2 is being turned on and transmitting electric potential to the local sense amplifier 160.

The (0_0)-th and (0_2)-th column selection transistors 142_0a_0 and 142_0a_2 are driven by gate signals from the same zeroth gate pattern GP0 and are thus turned on together.

As gate signals are selectively input to the first and second gate patterns GP1 and GP2, the (1_4)-th and (2_4)-th column selection transistors 142_1_4 and 142_2_4 are selectively turned on.

As gate signals are selectively input to the first and second gate patterns GP1 and GP2, the (1_4)-th and (2_4)-th column selection transistors 142_1_4 and 142_2_4 are selectively turned on.

As gate signals are selectively input to the first and second gate patterns GP1 and GP2, the (1_6)-th and (2_6)-th column selection transistors 142_1_6 and 142_2_6 are selectively turned on.

As the (1_0)-th through (1_6)-th column selection transistors 142_1_0 through 142_1_6 are driven by gate signals from the same first gate pattern GP1, the (1_0)-th through (1_6)-th column selection transistors 142_1_0 through 142_1_6 are turned on together to transmit electric potential to the local sense amplifier 160.

As gate signals are selectively input to the central gate pattern GPc and the (x+1)-th gate pattern GPx+1, the fourth central column selection transistor 142_c_4 and the (x+1_4)-th column selection transistor 142_x+1_4 are selectively turned on. Thus, the (x+1_4)-th column selection transistor 142_x+1_4 is turned off while the fourth central column selection transistor 142_c_4 is being turned on and transmitting electric potential to the local sense amplifier 160.

As gate signals are selectively input to the central gate pattern GPc and the (x+1)-th gate pattern GPx+1, the sixth central column selection transistor 142_c_6 and the (x+1_6)-th column selection transistor 142_x+1_6 are selectively turned on. Thus, the (x+1_6)-th column selection transistor 142_x+1_6 is turned off while the sixth central column selection transistor 142_c_6 is being turned on and transmitting electric potential to the local sense amplifier 160.

As the zeroth through sixth central column selection transistors 142_c_0 through 142_c_6 are driven by gate signals from the same central gate pattern GPc, the zeroth through sixth central column selection transistors 142_c_0 through 142_c_6 are turned on together to transmit electric potential to the local sense amplifier 160.

The zeroth gate pattern GP0 is disposed outside the first and second outer lines EL1 and EL2, and has an angle U shape. The zeroth gate pattern GP0 is electrically connected to the (0_0)-th and (0_2)-th bitlines BL0_0 and BL0_2.

Thus, the center line CL intersects the center of the central gate pattern GPc, but does not intersect the first through fourth central metal contacts MCc_1 through MCc_4, which are connected to local I/O signals. Since the center line CL does not intersect the first through fourth central metal contacts MCc_1 through MCc_4, the center line CL does not overlap with a dummy cell area where data is not stored, in a plan view. Conventional memory devices include one or more dummy cell areas that increase the number of data units that are parallel processed to improve speed of processing, but increase the area of the memory device. The present inventive concepts reduce the area occupied by the memory device by not including the one or more dummy cell areas used in conventional memory devices, but improve the data processing speed by using the elements and layout described herein.

Even though the first memory cell array 110_1 does not include a dummy cell area, the (0_1)-th through (6_1)-th local I/O lines LIO0_1 through L106_1 can be spaced apart from the (0_2)-th through (6_2)-th local I/O lines LIO0_2 through L106_2, respectively, with respect to the center line CL.

Due to the structure of the semiconductor memory device 100, the unit of processing data can be increased, the width, in the second direction Y, of the first memory cell array 110_1 can be reduced, and the size of a chip including the semiconductor memory device 100 can be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device comprising:
    first and second memory cell arrays spaced apart from each other in a first direction;
    a plurality of column selection transistors spaced apart from each other in a second direction which intersects the first direction, wherein the plurality of column selection transistors are between the first and second memory cell arrays, and wherein at least two of the column selection transistors comprise respective portions of a central gate pattern that intersects a central line extending in the first direction at a center of the first memory cell array and has a closed loop shape; and
    first and second local input/output lines configured to provide electric potential through the first memory cell array to a local sense amplifier based on operations of the column selection transistors,
    wherein the first and second local input/output lines extend in the second direction and are electrically connected to the central gate pattern, and
    wherein the center line is spaced apart from, and does not intersect the first and second local input/output lines in a plan view.

2. The semiconductor memory device of claim 1, wherein the center line does not overlap with dummy cells where data is not stored, in a plan view.

3. The semiconductor memory device of claim 2, wherein the first memory cell array does not include the dummy cells.

4. The semiconductor memory device of claim 1,
    wherein the column selection transistors comprise a plurality of central column selection transistors, and
    wherein the plurality of central column selection transistors comprise respective portions of the central gate pattern.

5. The semiconductor memory device of claim 4, wherein the central column selection transistors are configured to be turned on in response to a gate signal from the central gate pattern.

6. The semiconductor memory device of claim 4, further comprising:
    a first outer bitline of a plurality of bitlines, wherein the first outer bitline extends in the first direction over the first memory cell array and is a farthest one of the plurality of bitlines from the center line in the second direction; and
    a second outer bitline of the plurality of bitlines, wherein the second outer bitline extends in the first direction over the first memory cell array and is a farthest one of the plurality of bitlines from the first outer bitline in the second direction,
    wherein the central column selection transistors further comprise a first outer column selection transistor configured to control electric potential between the first outer bitline and the local sense amplifier, and a second outer column selection transistor configured to control electric potential between the second outer bitline and the local sense amplifier.

7. The semiconductor memory device of claim 6, wherein the first outer column selection transistor and the second outer column selection transistor are configured to provide electric potential to the local sense amplifier while the central column selection transistors are turned on and are providing electric potential to the local sense amplifier.

8. The semiconductor memory device of claim 4,
    wherein the central column selection transistors comprise a first central column selection transistor which is electrically connected to the first local input/output line, and a second central column selection transistor which is electrically connected to the second local input/output line, and
    wherein the first and second central column selection transistors are on opposite sides with respect to the center line.

9. The semiconductor memory device of claim 1, wherein at least two of the column selection transistors comprise portions of respective neighboring gate patterns having a same closed loop shape as the central gate pattern and that are adjacent to the central gate pattern.

10. The semiconductor memory device of claim 9,
    wherein the column selection transistors comprise respective neighboring column selection transistors that comprise portions of the respective neighboring gate patterns, and
    wherein the neighboring gate pattern and the central gate pattern are configured to selectively receive gate signals.

11. The semiconductor memory device of claim 10,
    wherein the respective neighboring column selection transistors share respective metal contacts with respective central column selection transistors,
    wherein the central column selection transistors are configured to be turned on by the central gate pattern, and
    wherein the neighboring column selection transistors and the central column selection transistors are connected to respective ones of the first local input/output lines through the respective metal contacts.

12. A semiconductor memory device comprising:
first and second memory cell arrays spaced apart from each other in a first direction;
a central bitline of a plurality of bitlines that extends in the first direction over the first memory cell array, wherein the central bitline is a closest one of the plurality of bitlines to a center line that extends in the first direction at a center of the first memory cell array;
a first outer bitline of the plurality of bitlines, wherein the first outer bitline extends in the first direction over the first memory cell array and is a farthest one of the plurality of bitlines from the center line in a second direction which intersects the first direction;
a second outer bitline of the plurality of bitlines, wherein the second outer bitline extends in the first direction over the first memory cell array and is a farthest one of the plurality of bitlines from the first outer bitline in the second direction;
central column selection transistors configured to control electric potential between the central bitline and a local sense amplifier;
a first outer column selection transistor configured to control electric potential between the first outer bitline and the local sense amplifier; and
a second outer column selection transistor configured to control electric potential between the second outer bitline and the local sense amplifier,
wherein the first and second outer column selection transistors are configured to provide electric potential to the local sense amplifier while the central column selection transistors are providing electric potential to the local sense amplifier, and
wherein the central column selection transistors comprise first and second central column selection transistors which each comprises respective portions of a central gate pattern that intersects the center line and has a closed loop shape.

13. The semiconductor memory device of claim 12, wherein the first and second central column selection transistors are configured to be turned on in response to a gate signal from the central gate pattern.

14. The semiconductor memory device of claim 13, wherein the first and second central column selection transistors are on opposite sides with respect to the center line.

15. The semiconductor memory device of claim 13, further comprising:
a neighboring column selection transistor sharing a metal contact with the first central column selection transistor and is connected to the local sense amplifier through the metal contact.

16. The semiconductor memory device of claim 15, wherein the neighboring column selection transistor comprises a portion of a neighboring gate pattern that has a same closed loop shape as the central gate pattern and is adjacent to the central gate pattern, and
wherein the neighboring gate pattern and the central gate pattern are configured to selectively receive gate signals.

17. A memory system comprising:
a memory controller configured to send a request for an input or an output of data;
an input/output buffer configured to input or output the data in response to the request;
first and second memory cell arrays configured to store the data and configured to input the data to or output the data from the input/output buffer, wherein the first and second memory cell arrays are spaced apart from each other in a first direction;
a plurality of column selection transistors in a second direction which intersects the first direction, wherein the plurality of column selection transistors are between the first and second memory cell arrays, and wherein at least two of the column selection transistors comprise respective portions of a central gate pattern that intersects a central line extending in the first direction at a center of the first memory cell array and has a closed loop shape; and
first and second local input/output lines configured to provide electric potential through the first memory cell array to a local sense amplifier based on operations of the column selection transistors,
wherein the first and second local input/output lines extend in the second direction and are electrically connected to the central gate pattern, and
wherein the center line is spaced apart from, and does not intersect the first and second local input/output lines in a plan view.

18. The memory system of claim 17, wherein the first memory cell array does not include dummy cells where data is not stored.

19. The memory system of claim 17, further comprising:
a first outer bitline of a plurality of bitlines, wherein the first outer bitline extends in the first direction over the first memory cell array and is a farthest one of the plurality of bitlines from the center line in the second direction; and
a second outer bitline of the plurality of bitlines, wherein the second outer bitline extends in the first direction over the first memory cell array and is farthest one of the plurality of bitlines from the first outer bitline in the second direction,
wherein the column selection transistors comprise a plurality of central column selection transistors that comprise respective portions of the central gate pattern, a first outer column selection transistor configured to control electric potential between the first outer bitline and the local sense amplifier, and a second outer column selection transistor configured to control electric potential between the second outer bitline and the local sense amplifier, and
wherein the first outer column selection transistor and the second outer column selection transistor are configured to provide electric potential to the local sense amplifier while the central column selection transistors are turned on and are providing electric potential to the local sense amplifier.

20. The memory system of claim 17, wherein the input/output buffer is configured to input or output the data in units of 16 bits.

* * * * *